(12) United States Patent
Cho et al.

(10) Patent No.: US 10,083,884 B2
(45) Date of Patent: Sep. 25, 2018

(54) COMPACT HIGH-VOLTAGE SEMICONDUCTOR PACKAGE

(71) Applicant: Infineon Technologies Americas Corp., El Segundo, CA (US)

(72) Inventors: Eung San Cho, Torrance, CA (US); Chuan Cheah, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/675,005

(22) Filed: Aug. 11, 2017

(65) Prior Publication Data

US 2017/0365533 A1 Dec. 21, 2017

Related U.S. Application Data

(62) Division of application No. 14/849,178, filed on Sep. 9, 2015, now Pat. No. 9,768,087.

(Continued)

(51) Int. Cl.
*H01L 23/04* (2006.01)
*H01L 23/495* (2006.01)
(Continued)

(52) U.S. Cl.
CPC .......... *H01L 23/04* (2013.01); *H01L 23/3107* (2013.01); *H01L 23/49517* (2013.01);
(Continued)

(58) Field of Classification Search
CPC ................ H01L 23/04; H01L 23/3107; H01L 23/49517; H01L 23/49562; H01L 23/49575; H01L 23/5386; H01L 23/58; H01L 25/074; H01L 25/115; H01L 25/117; H01L 25/18; H01L 29/16; H01L 29/2003;
(Continued)

(56) References Cited

U.S. PATENT DOCUMENTS 7,199,461 B2   4/2007   Son et al.
9,343,440 B2*  5/2016   McDonald ............ H01L 25/074
(Continued)

FOREIGN PATENT DOCUMENTS

EP     2525400 A1   11/2012

OTHER PUBLICATIONS

Extended Search Report from counterpart European Application No. 15185158.1, dated Mar. 4, 2016, 7 pp.
(Continued)

*Primary Examiner* — Allan R Wilson
(74) *Attorney, Agent, or Firm* — Shumaker & Sieffert, P.A.

(57) ABSTRACT

There are disclosed herein various implementations of a compact high-voltage semiconductor package. In one exemplary implementation, such a semiconductor package includes a power transistor, as well as a drain contact, a source contact, and a gate contact to provide external connections to the power transistor. The semiconductor package also includes a contour element formed between the drain contact and the source contact in the semiconductor package. The contour element increases a creepage distance between the drain contact and the source contact in the semiconductor package so as to increase a breakdown voltage of the semiconductor package.

10 Claims, 8 Drawing Sheets

Related U.S. Application Data

(60) Provisional application No. 62/061,479, filed on Oct. 8, 2014.

(51) Int. Cl.
    *H01L 29/78*     (2006.01)
    *H01L 29/778*    (2006.01)
    *H01L 29/20*     (2006.01)
    *H01L 29/16*     (2006.01)
    *H01L 25/18*     (2006.01)
    *H01L 25/11*     (2006.01)
    *H01L 25/07*     (2006.01)
    *H01L 23/58*     (2006.01)
    *H01L 23/538*    (2006.01)
    *H01L 23/31*     (2006.01)

(52) U.S. Cl.
    CPC .. *H01L 23/49562* (2013.01); *H01L 23/49575* (2013.01); *H01L 23/5386* (2013.01); *H01L 23/58* (2013.01); *H01L 25/074* (2013.01); *H01L 25/115* (2013.01); *H01L 25/117* (2013.01); *H01L 25/18* (2013.01); *H01L 29/16* (2013.01); *H01L 29/2003* (2013.01); *H01L 29/778* (2013.01); *H01L 29/7827* (2013.01); *H01L 2224/48091* (2013.01); *H01L 2224/73265* (2013.01)

(58) Field of Classification Search
    CPC ............... H01L 29/778; H01L 29/7827; H01L 2224/48091; H01L 2224/73265
    See application file for complete search history.

(56) References Cited

U.S. PATENT DOCUMENTS

| | | |
|---|---|---|
| 2001/0054752 A1 | 12/2001 | Woodworth et al. |
| 2002/0113325 A1 | 8/2002 | Kim |
| 2004/0232541 A1 | 11/2004 | Son et al. |
| 2005/0133913 A1 | 6/2005 | Okamoto |
| 2010/0258925 A1 | 10/2010 | Jeon et al. |
| 2012/0061819 A1 | 3/2012 | Siemieniec et al. |
| 2012/0146202 A1 | 6/2012 | Xue et al. |
| 2012/0223321 A1 | 9/2012 | Lin et al. |
| 2012/0256189 A1 | 10/2012 | McDonald et al. |
| 2012/0292753 A1 | 11/2012 | Cho |
| 2014/0008702 A1 | 1/2014 | Otremba et al. |
| 2014/0225162 A1* | 8/2014 | Briere ................. H01L 21/8252 257/195 |
| 2015/0228610 A1 | 8/2015 | Cho |
| 2015/0262903 A1 | 9/2015 | Lohia et al. |
| 2015/0279757 A1 | 10/2015 | Tan et al. |
| 2016/0104697 A1 | 4/2016 | Cho et al. |

OTHER PUBLICATIONS

Response to Extended Search Report dated Mar. 4, 2016, from counterpart European Application No. 15185158.1, filed Oct. 13, 2016, 14 pp.

Prosecution History from U.S. Appl. No. 14/849,178, from Aug. 8, 2016 through May 17, 2017, 63 pp.

\* cited by examiner

COMPACT HIGH-VOLTAGE SEMICONDUCTOR PACKAGE

This application is a divisional application of U.S. patent application Ser. No. 14/849,178 filed on Sep. 9, 2015, the entire content of which is incorporated by reference, which claims the benefit of and priority to a provisional application entitled "Stackable or Flip Package for HV GaN Power QFN," Ser. No. 62/061,479 filed on Oct. 8, 2014, the entire content of which is incorporated by reference.

BACKGROUND

I. Definition

As used herein, "M-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x-y)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium. A III-N or a GaN transistor may also refer to a composite high-voltage enhancement mode transistor that is formed by connecting the III-N or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

It is noted that, as used herein, the terms "low-voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high-voltage" or "HV," as used herein, refers to a voltage range from approximately two hundred volts to approximately twelve hundred volts (approximately 200V to 1200V), or higher.

II. Background Art

In high power and high performance applications, group III-V transistors, for example III-Nitride heterostructure field-effect transistors (HFETs) such as gallium nitride (GaN) based high mobility electron transistors (HEMTs), are often desirable due to their high efficiency and high-voltage operation. Despite the performance advantages attributable to use of group III-V transistors in power applications, however, conventional packaging solutions for such devices tend to be sized according to creepage distance constraints in order to assure adequately high package breakdown voltages. As a result, those conventional packaging solutions typically have form factors that are substantially larger than the dimensions of the group III-V transistors they house. As the devices and systems utilizing III-Nitride or other group III-V power transistors become ever smaller, package form factors with dimensions closer to actual transistor dimensions are increasingly needed.

SUMMARY

The present disclosure is directed to a compact high-voltage semiconductor package, substantially as shown in and/or described in connection with at least one of the figures, and as set forth more completely in the claims.

DETAILED DESCRIPTION

Figure 1:
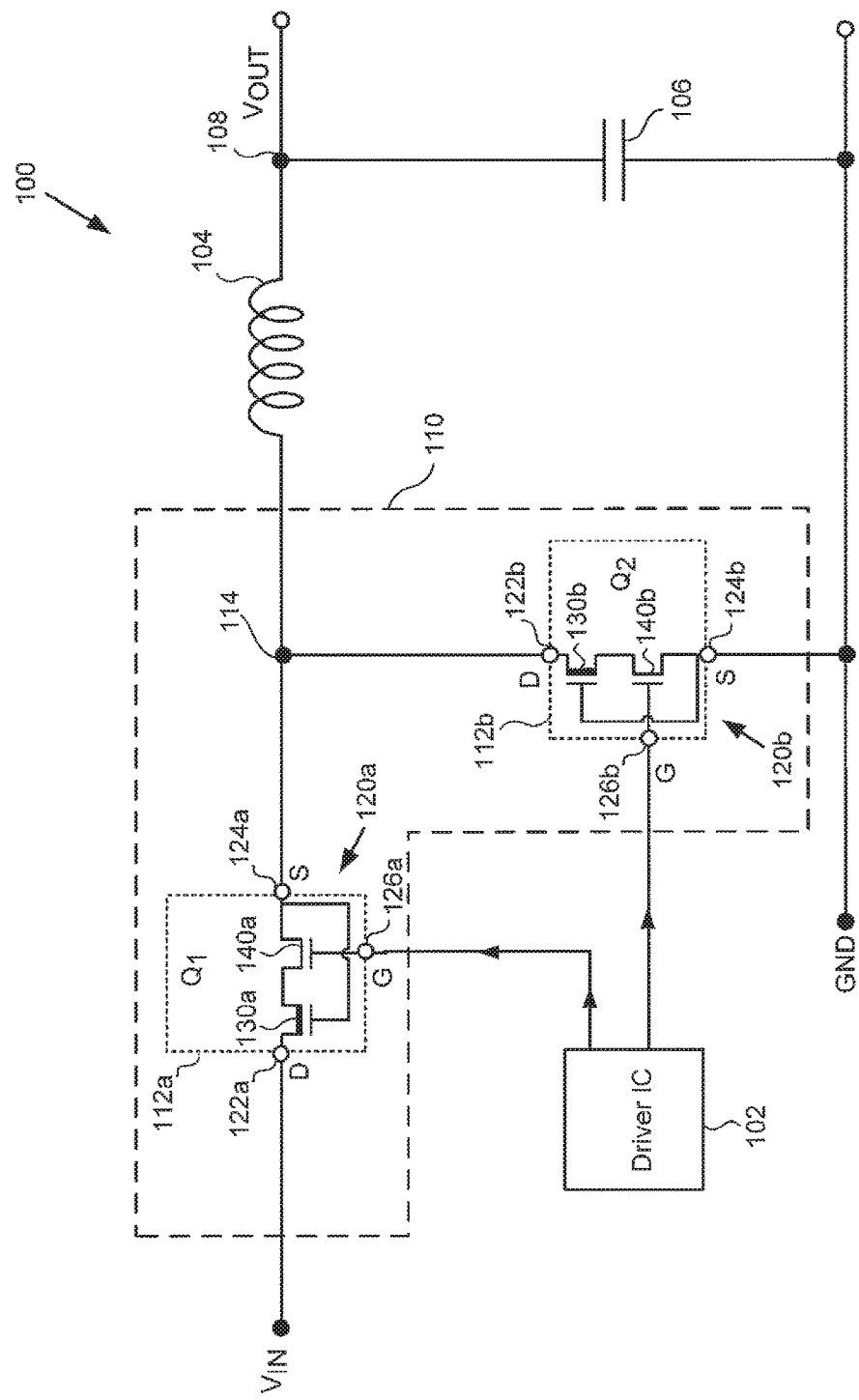
FIG. 1 shows an exemplary half bridge voltage converter circuit including high side and low side composite power transistors.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, in high power and high performance applications, group III-V transistors, for example III-Nitride heterostructure field-effect transistors (HFETs) such as gallium nitride (GaN) based high mobility electron transistors (HEMTs), are often desirable due to their high efficiency and high-voltage operation. III-Nitride and other group III-V materials are semiconductor compounds having a relatively wide, direct bandgap and strong piezoelectric polarizations, and can enable high breakdown fields, high saturation velocities, and the creation of two-dimensional electron gases (2-DEGs). As a result, III-Nitride materials such as GaN, for example, are used in many microelectronic applications as depletion mode (i.e., normally ON) and enhancement mode (i.e., normally OFF) power transistors.

In some implementations in which normally OFF characteristics of a power transistor are desired, a low-voltage (LV) enhancement mode silicon or other normally OFF group IV FET can be cascoded with a depletion mode high-voltage (HV) III-Nitride or other group III-V FET to produce a normally OFF composite HV power transistor. Such a configuration allows for use of the LV group IV FET to control the flow of current through the composite power transistor, thereby conferring several advantages of the LV group IV FET to the composite device. Examples of those advantages include robust and reliable gate drive behavior, and the relatively low gate turn-off current associated with LV silicon or other LV group IV FETs.

Despite the performance advantages attributable to use of group III-V transistors in power applications, as well as their versatility for use in composite transistors, conventional packaging solutions for HV group III-V transistors tend to be oversized in order to assure adequate package resistance to voltage breakdown. In other words, conventional packages for HV group III-V transistors may be sized according to creepage distance constraints, rather than to the dimensions of the transistors housed by those conventional packages. As a result, conventional packages typically have form factors that are substantially larger than the dimensions of the group III-V transistors and composite power transistors they enclose.

As the devices and systems utilizing III-Nitride or other group III-V power transistors become ever smaller, packaging solutions enabling form factors with dimensions closer to actual transistor dimensions are increasingly needed. The present application is directed to such a compact high-voltage semiconductor packaging solution. As will be described in greater detail below, the semiconductor packages disclosed in the present application include one or more contour elements for advantageously increasing a creepage distance in the semiconductor packages so as to increase their breakdown voltage, while concurrently providing a form factor having reduced dimensions relative to conventional packaging solutions.

Referring to FIG. 1, FIG. 1 shows an exemplary half bridge voltage converter circuit including high side and low side composite power transistors. Voltage converter 100 includes driver integrated circuit (IC) 102 for providing drive signals to power stage multi-chip module (MCM) 110. In addition, voltage converter 100 includes output inductor 104, and output capacitor 106. As shown in FIG. 1, voltage converter 100 is configured to receive an input voltage $V_{IN}$, and to provide a converted voltage, e.g., a rectified and/or stepped down voltage, as $V_{OUT}$ at output 108.

According to the implementation shown in FIG. 1, power stage MCM 110 may be configured to house a half bridge power stage including two power switches in the form of composite power transistors. That is to say, power stage MCM 110 may include high side or control composite power transistor 120*a* ($Q_1$) including group IV transistor 140*a* cascoded with HV group III-V transistor 130*a* and having composite drain 122*a*, composite source 124*a*, and composite gate 126*a*. Moreover, power stage MCM 110 may also include low side or synchronous (sync) composite power transistor 120*b* ($Q_2$) including group IV transistor 140*b* cascoded with HV group III-V transistor 130*b* and having composite drain 122*b*, composite source 124*b*, and composite gate 126*b*.

It is noted that in some implementations, it may be advantageous or desirable to package control composite power transistor 120*a* and sync composite power transistor 120*b* individually. As shown in FIG. 1, in those implementations, control composite power transistor 120*a* may be packaged using semiconductor package 112*a*, while sync composite power transistor 120*b* may be separately packaged using semiconductor package 112*b*. Control composite power transistor 120*a* is coupled with sync composite power transistor 120*b* at switch node 114, which, in turn, is coupled to output 108 through output inductor 104. Voltage converter 100 may be advantageously utilized as a buck converter, for example, in a variety of automotive, industrial, appliance, and lighting applications.

Figure 2:
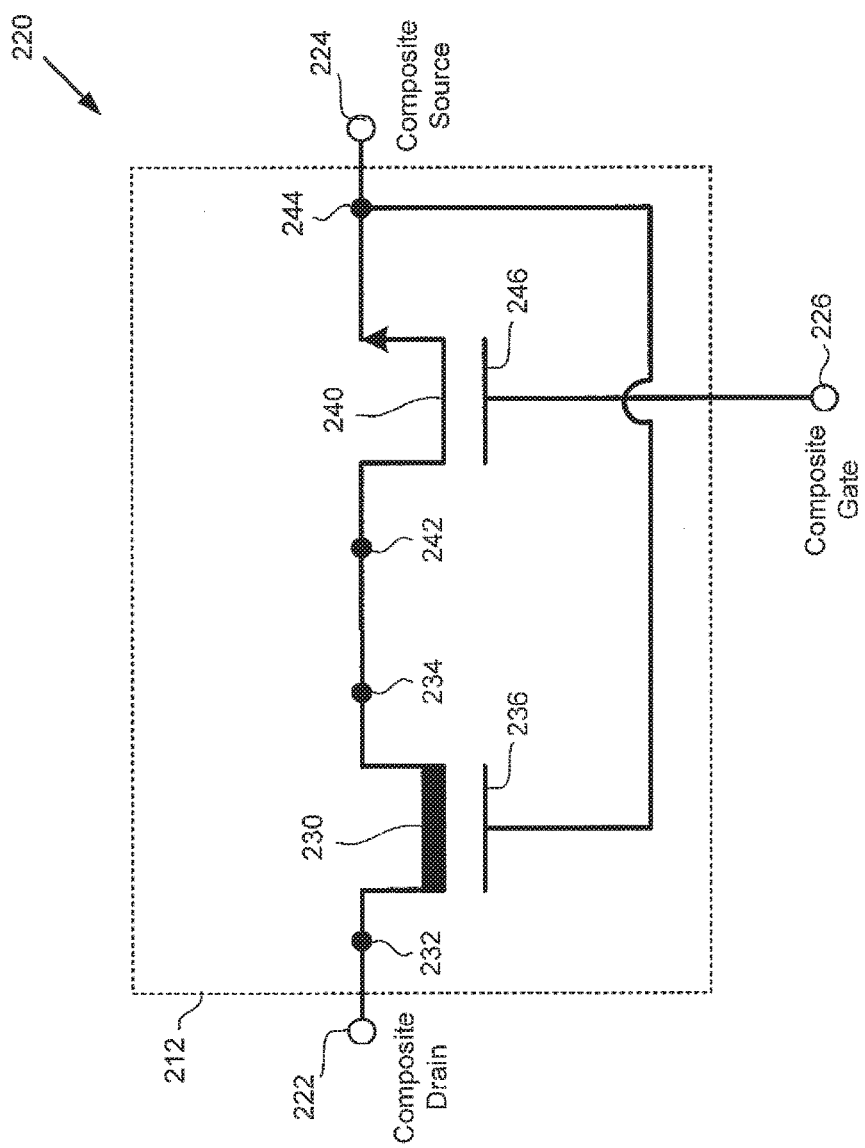
FIG. 2 shows a diagram of a semiconductor package including an exemplary composite power transistor suitable for use in the voltage converter of FIG. 1.

Moving to FIG. 2, FIG. 2 shows a diagram of semiconductor package 212 including composite power transistor 220 suitable for use as either or both of high side composite power transistor 120*a* and low side composite power transistor 120*b*, in FIG. 1. In other words, semiconductor package 212, in FIG. 2, corresponds in general to either or both of semiconductor packages 112*a* and 112*b*, in FIG. 1.

As shown in FIG. 2, composite power transistor 220 includes III-Nitride or other group III-V FET 230, and group IV FET 240 cascoded with group III-V FET 230. Also shown in FIG. 2 are composite drain 222, composite source 224, and composite gate 226 of composite power transistor 220, as well as drain 232, source 234, and gate 236 of group III-V FET 230, and drain 242, source 244, and gate 246 of group IV FET 240.

Group III-V FET 230 may be a normally ON III-Nitride power FET and may be implemented as a depletion mode heterostructure HFET, for example. In one implementation, group III-V FET 230 may take the form of a depletion mode HEMT configured to incorporate a 2-DEG. According to one implementation, for example, group III-V FET 230 may be an HV FET, as defined above in the Definition section. Specifically, in one implementation, group III-V FET 230 may be a GaN or other III-Nitride HEMT configured to sustain an operating voltage of approximately 600V.

Group IV FET 240 may be implemented as an LV group IV FET, as defined above in the Definition section. For example, group IV FET 240 may be an LV vertical channel FET, such as a normally OFF silicon trench type vertical channel FET, for example. According to one implementation, group IV FET 240 may be a silicon MISFET or MOSFET, for example. However, in other implementations, group IV FET 240 may include any suitable group IV material, such as silicon carbide (SiC), germanium (Ge), silicon germanium (SiGe), or a strained group IV element or compound, for example.

The cascoded combination of group IV FET 240 with group III-V FET 230 provides composite power transistor 220, which according to the implementation shown in FIG.

2 can be configured as a composite three terminal device functioning in effect as a normally OFF composite HV power FET having composite source 224 and composite gate 226 provided by LV group IV FET 240, and composite drain 222 provided by HV group III-V FET 230. That is to say, drain 242 of group IV FET 240 is coupled to source 234 of group III-V FET 230, source 244 of group IV FET 240 provides composite source 224 for composite power transistor 220, and gate 246 of group IV FET 240 provides composite gate 226 for composite power transistor 220. Moreover, drain 232 of group III-V FET 230 provides composite drain 222 for composite power transistor 220, while gate 236 of group III-V FET 230 is electrically coupled to source 244 of group IV FET 240.

Figure 3A:
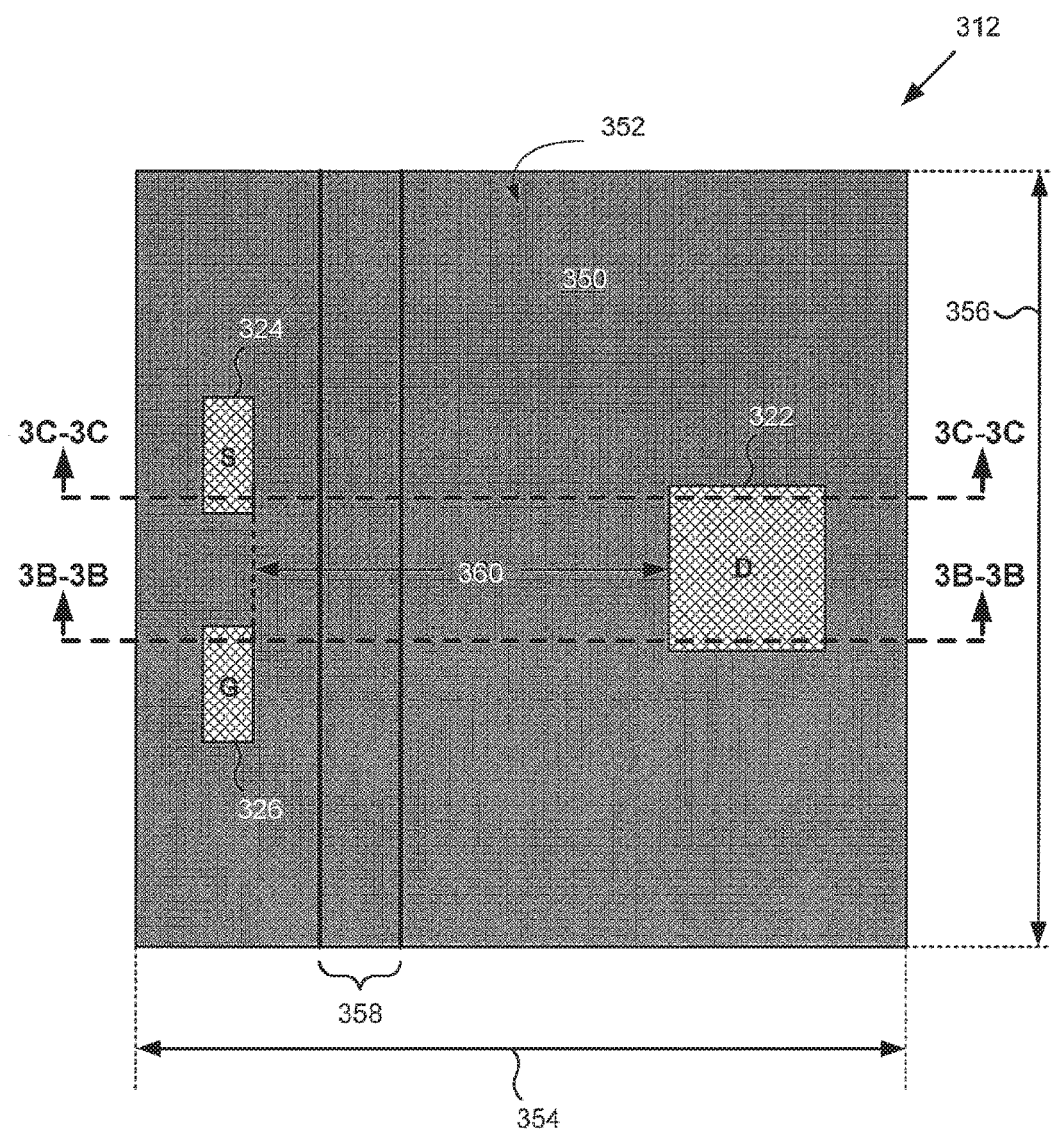
FIG. 3A shows a top view of a compact high-voltage semiconductor package, according to one implementation.

Continuing to FIG. 3A, FIG. 3A shows a top view of a compact high-voltage semiconductor package, according to one implementation. Semiconductor package 312 includes drain contact 322, source contact 324, and gate contact 326, each surrounded by packaging dielectric 350. As shown in FIG. 3A, packaging dielectric 350 has top surface 352 and includes contour element 358 formed in packaging dielectric 350 between drain contact 322 and source contact 324. As further shown in FIG. 3A, semiconductor package has width 354 and length 356, while linear distance 360 is the shortest distance separating drain contact 322 from source contact 324, and separating drain contact 322 from gate contact 326. Also shown in FIG. 3A are perspective lines 3B-3B and 3C-3C corresponding respectively to the cross-sectional views shown by FIGS. 3B and 3C and discussed below.

It is noted that, according to the exemplary implementation shown in FIG. 3A, contour element 358 is an elongated element, such as a groove or a ridge formed in packaging dielectric 350, and traversing substantially the entire length 356 of semiconductor package 312. However, in some other implementations, contour element 358 may be formed in packaging dielectric 350 so as to traverse less than the entirety of length 356. It is further noted that according to the present exemplary implementation, each of drain contact 322, source contact 324, and gate contact 326 is substantially coplanar with packaging dielectric 350 at top surface 352 of packaging dielectric 350.

Semiconductor package 312 corresponds in general to either or both of semiconductor packages 112a and 112b, in FIG. 1, as well as to semiconductor package 212, in FIG. 2, and may be designed as a surface-mount package. For example, semiconductor package 312 may be implemented as a Quad Flat No-leads (QFN) package having dimensions of less than 5 mm×5 mm. That is to say, according to the implementation shown in FIG. 3A, each of width 354 and length 356 may be less than five millimeters (<5.0 mm), such as 4 mm, or 3 mm, for example.

Figure 3B:
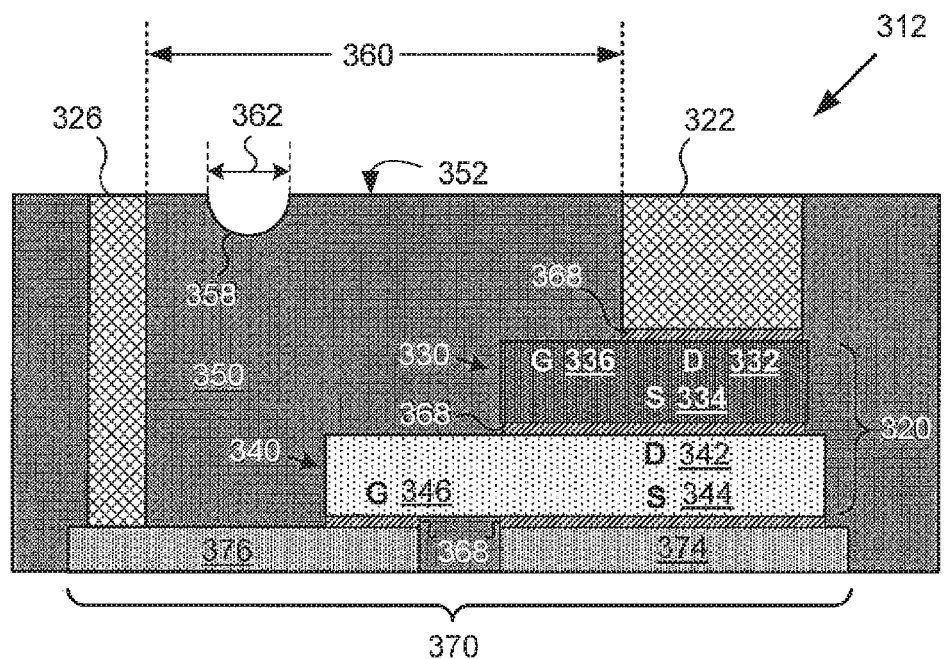
FIG. 3B shows a first cross-sectional view of the compact high-voltage semiconductor package of FIG. 3A, according to one implementation.

Referring to FIG. 3B, FIG. 3B shows a cross-sectional view of semiconductor package 312 along perspective lines 3B-3B, in FIG. 3A, according to one implementation. FIG. 3B shows drain contact 322, gate contact 326, packaging dielectric 350 having top surface 352, and contour element 358 shown in FIG. 3A, from a different perspective. In addition, FIG. 3B shows linear distance 360 separating drain contact 322 from gate contact 326 in semiconductor package 312, and width 362 of contour element 358. It is noted that source contact 324, shown in FIG. 3A, is not visible in FIG. 3B due to source contact 324 being situated behind and thus obscured by gate contact 326, from the perspective shown in FIG. 3B.

As shown by FIG. 3B, semiconductor package 312 includes composite power transistor 320 including group III-V FET 330 situated so as to be die stacked over group IV FET 340. According to the exemplary implementation shown in FIG. 3B, group IV FET 340 is a vertical channel FET having source 344 and gate 346 on a front side (shown as bottom side of group IV FET 340 in FIG. 3B), and drain 342 on a back side (shown as top side of group IV FET 340 in FIG. 3B) opposite the front side providing source 344 and gate 346. Moreover, according to the implementation shown in FIG. 3B, group III-V FET 330 is implemented having a "top drain" configuration in which drain 332 and gate 336 are situated on a top side of group III-V FET 330, and source 334 is situated on a bottom side of group III-V FET 330 opposite the top side providing drain 332 and gate 336.

As further shown by FIG. 3B, semiconductor package 312 includes conductive carrier 370 including gate conductive carrier segment 376 and source conductive carrier segment 374. Also shown in FIG. 3B is electrically conductive die attach material 368 mechanically and electrically coupling drain contact 322 to drain 332 of group III-V FET 330, source 334 of group III-V FET 330 to drain 342 of group IV FET 340, source 344 of group IV FET to source conductive carrier segment 374, and gate 346 of group IV FET 340 to gate conductive carrier segment 376.

Conductive carrier 370 may be formed of any conductive material having a suitably low electrical resistance. Examples of materials from which conductive carrier 370 may be formed include copper (Cu), aluminum (Al), or a conductive alloy. In one implementation, conductive carrier 370 may be implemented using a semiconductor package lead frame. Gate contact 326 and drain contact 322 may take the form of conductive blocks or pillars and may be implemented using Cu, Al, a conductive alloy, or solder material, for example.

Electrically conductive die attach material 368 may be any suitable substance, such as a conductive epoxy, solder, a conductive sintered material, or diffusion bonded material, for example. Packaging dielectric 350 may be any suitable electrically insulating material used as overmolding or encapsulation in semiconductor packaging.

Composite power transistor 320 including group III-V FET 330 and group IV FET 340 corresponds in general to any or all of composite power transistors 120a, 120b, or 220, in FIGS. 1 and 2, and may share any of the characteristics attributed to those corresponding features, above. In addition, drain contact 322 and gate contact 326, in FIG. 3B, correspond respectively in general to composite drains 122a, 122b, 222 and to composite gates 126a, 126b, 226, in FIGS. 1 and 2, and may share any of the characteristics attributed to those corresponding features, above.

Figure 3C:
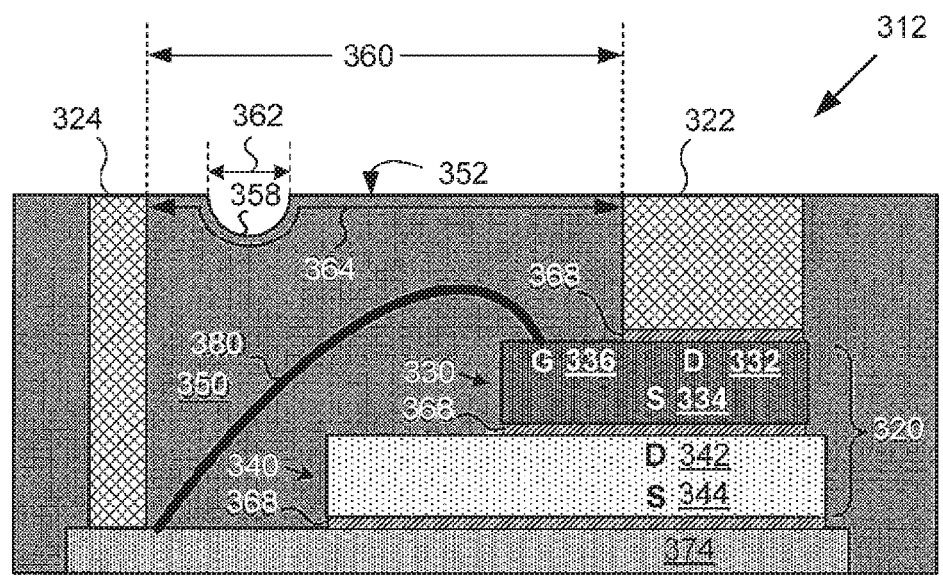
FIG. 3C shows a second cross-sectional view of the compact high-voltage semiconductor package of FIG. 3A, according to the exemplary implementation shown in FIG. 3B.

Referring now to FIG. 3C, FIG. 3C shows a cross-sectional view of semiconductor package 312 along perspective lines 3C-3C, in FIG. 3A, according to one implementation. In addition to the features shown in FIG. 3A and FIG. 3B, FIG. 3C shows semiconductor package 312 to include source contact 324 and one or more bond wires 380 electrically coupling gate 336 of group III-V FET 330 to source 344 of group IV FET 340 via source conductive carrier segment 374 and electrically conductive die attach material 368. Also shown in FIG. 3C is creepage distance 364 corresponding to the effective electrical isolation distance of drain contact 322 from source contact 324 due to the presence of contour element 358.

It is noted that gate contact 326, shown in FIGS. 3A and 3B, is not visible in FIG. 3C due to the cross-section shown in FIG. 3C being taken between gate contact 326 and source contact 324. Like drain contact 322 and gate contact 326, source contact 324 may take the form of conductive blocks or pillars and may be implemented using Cu, Al, a conductive alloy, or a solder material, for example. Source contact 324 corresponds in general to composite sources 124a, 124b, and 224 in FIGS. 1 and 2, and may share any of the characteristics attributed to those corresponding features, above.

Referring to FIGS. 3A, 3B, and 3C in combination, semiconductor package 312 is shown to include a power transistor in the form of composite power transistor 320. Semiconductor package 312 also includes drain contact 322, source contact 324, and gate contact 326 providing external connections to composite power transistor 320. In addition, contour element 358 is formed between drain contact 322 and source contact 324 in semiconductor package 312. As shown in FIG. 3C, contour element 358 increases creepage distance 364 between drain contact 322 and source contact 324 in semiconductor package 312 so as to increase a breakdown voltage of semiconductor package 312.

It is noted that although the implementations shown in FIGS. 3A, 3B, and 3C depict contour element 358 element as a concave element, such as a groove, with respect to top surface 352 of packaging dielectric 350, that representation is merely exemplary. In other implementations, contour element 358 may be convex with respect to top surface 352, and may take the form of a ridge in packaging dielectric 350 extruding above top surface 352.

Thus, the presence of contour element 358 between drain contact 322 and source contact 324 results in creepage distance 364 electrically isolating drain contact 322 from source contact 324 being greater than linear distance 360 physically separating drain contact 322 from source contact 324. Consequently, contour element 358 enables implementation of semiconductor package 312 having reduced dimensions, i.e., width 354 and length 356, while concurrently meeting the creepage distance requirements imposed by packaging of HV composite power transistor 320.

Figure 4A:
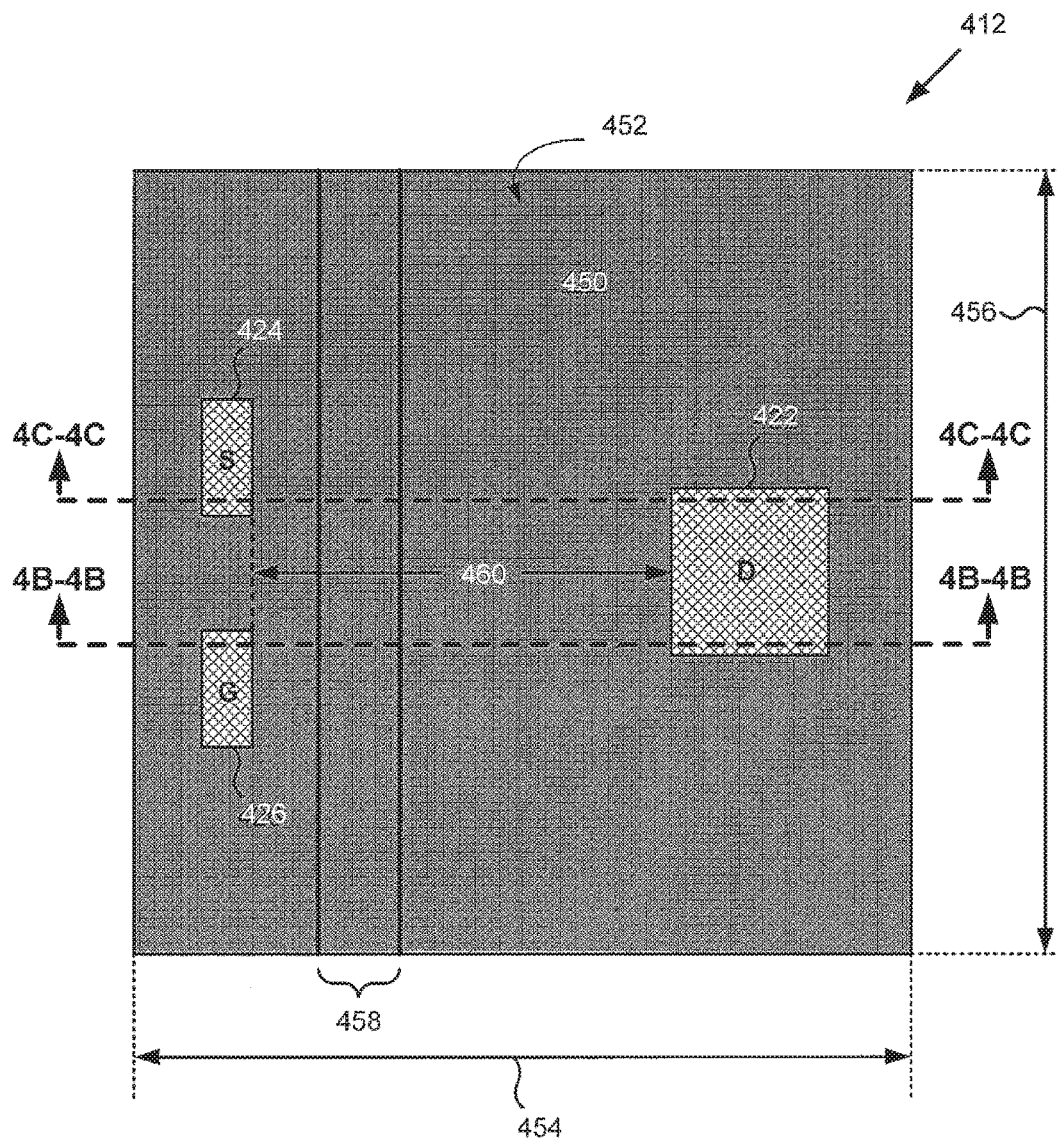
FIG. 4A shows a top view of a compact high-voltage semiconductor package, according to another implementation.

Moving to FIG. 4A, FIG. 4A shows a top view of another exemplary compact high-voltage semiconductor package. Semiconductor package 412 includes drain contact 422, source contact 424, and gate contact 426, each surrounded by packaging dielectric 450. As shown in FIG. 4A, packaging dielectric 450 has top surface 452 and includes contour element 458 formed in packaging dielectric 450 between drain contact 422 and source contact 424. As further shown in FIG. 4A, semiconductor package has width 454 and length 456, while linear distance 460 is the shortest distance separating drain contact 422 from source contact 424, and separating drain contact 422 from gate contact 426. Also shown in FIG. 4A are perspective lines 4B-4B and 4C-4C corresponding respectively to the cross-sectional views shown by FIGS. 4B and 4C and discussed below.

Semiconductor package 412 corresponds in general to semiconductor package 312, in FIGS. 3A, 3B, and 3C. That is to say, packaging dielectric 450 having top surface 452, contour element 458, drain contact 422, source contact 424, and gate contact 426 correspond respectively in general to packaging dielectric 350 having top surface 352, contour element 358, drain contact 322, source contact 324, and gate contact 326, and may share any of the characteristics attributed to those corresponding features, above. In addition, width 454, length 456, and linear distance 460, in FIG. 4A, correspond respectively in general to width 354, length 356, and linear distance 360, and may share any of the characteristics attributed to those corresponding features, above.

Figure 4B:
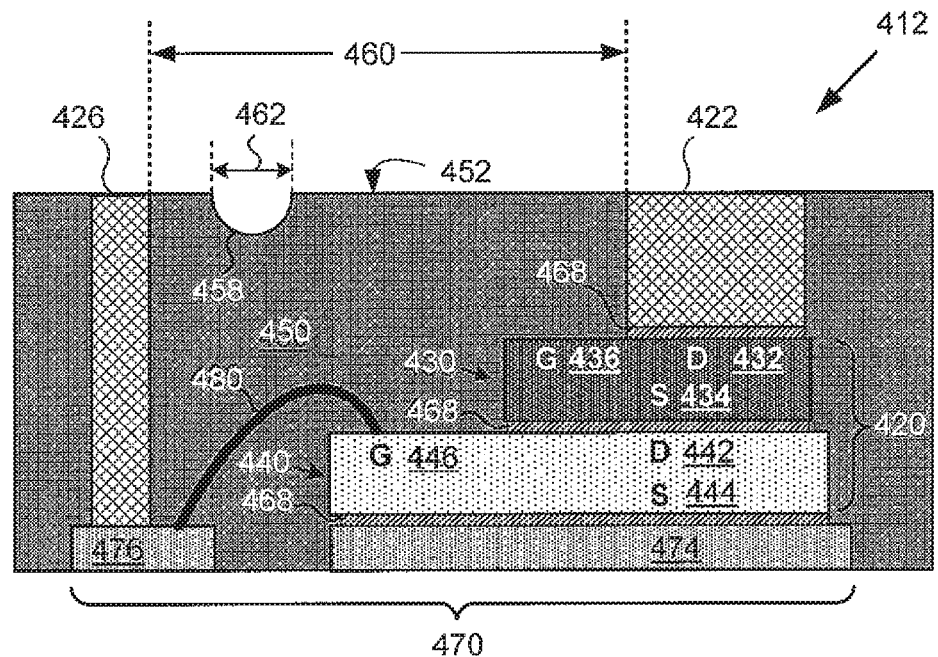
FIG. 4B shows a first cross-sectional view of the compact high-voltage semiconductor package of FIG. 4A, according to one implementation.

Referring to FIG. 4B, FIG. 4B shows a cross-sectional view of semiconductor package 412 along perspective lines 4B-4B, in FIG. 4A, according to one implementation. FIG. 4B shows drain contact 422, gate contact 426, packaging dielectric 450 having top surface 452, and contour element 458 shown in FIG. 4A, from a different perspective. In addition, FIG. 4B shows linear distance 460 separating drain contact 422 from gate contact 426 in semiconductor package 412, and width 462 of contour element 458 corresponding in general to width 362 in FIGS. 3B and 3C. It is noted that source contact 424, shown in FIG. 4A, is not visible in FIG. 4B due to source contact 424 being situated behind and thus obscured by gate contact 426, from the perspective shown in FIG. 4B.

As shown by FIG. 4B, semiconductor package 412 includes composite power transistor 420 including group III-V FET 430 situated so as to be die stacked over group IV FET 440. Composite power transistor 420 corresponds in general to any or all of composite power transistors 120a, 120b, or 220, in FIGS. 1 and 2, and may share any of the characteristics attributed to those corresponding features, above. In addition, group III-V FET 430 corresponds in general to group II-V FET 330, in FIGS. 3B and 3C, and may share any of the characteristics attributed to that corresponding feature, above.

Group IV FET 440 corresponds in general to any or all of group IV FETs 140a, 140b, or 240, in FIGS. 1 and 2, and may share any of the characteristics attributed to those corresponding features, above. In contrast to the implementation shown by FIGS. 3B and 3C, however, group IV FET 440 is a vertical channel FET having a "top drain" configuration in which drain 442 and gate 446 are situated on a top side of group IV FET 440, and source 444 is situated on a bottom side of group IV FET 440 opposite the top side providing drain 442 and gate 446.

As further shown by FIG. 4B, semiconductor package 412 includes conductive carrier 470 including gate conductive carrier segment 476 and source conductive carrier segment 474. Also shown in FIG. 4B is electrically conductive die attach material 468 mechanically and electrically coupling drain contact 422 to drain 432 of group III-V FET 430, source 434 of group III-V FET 430 to drain 442 of group IV FET 440, and source 444 of group IV FET to source conductive carrier segment 474. In addition, FIG. 4B shows one or more bond wires 480 electrically coupling gate 446 of group IV FET 440 to gate contact 426 via gate conductive carrier segment 476. Conductive carrier 470, electrically conductive die attach material 468, wire bond(s) 480, correspond respectively in general to conductive carrier 370, electrically conductive die attach material 368, wire bond(s) 380, in FIGS. 3B and 3C, and may share any of the features attributed to those corresponding features, above.

Figure 4C:
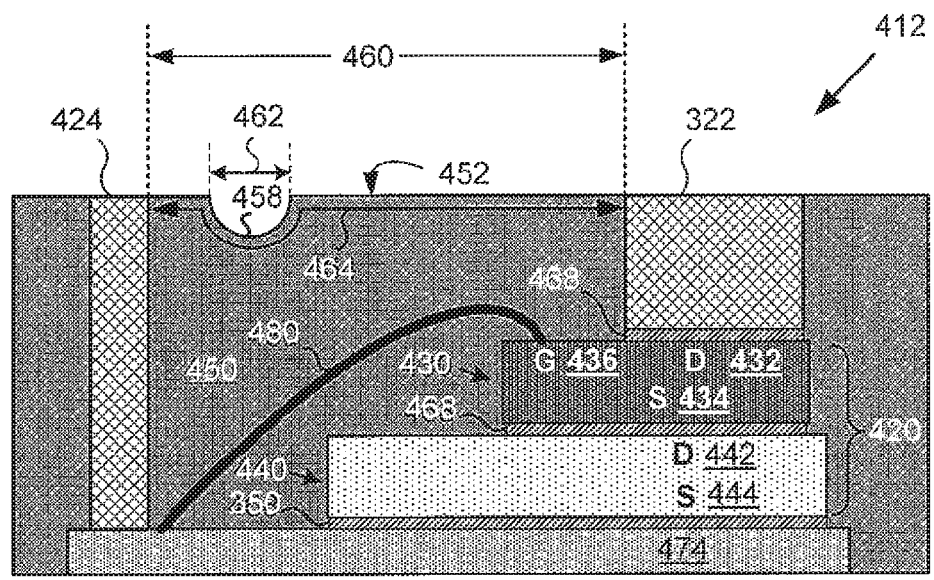
FIG. 4C shows a second cross-sectional view of the compact high-voltage semiconductor package of FIG. 4A, according to the exemplary implementation shown in FIG. 4B.

Referring now to FIG. 4C, FIG. 4C shows a cross-sectional view of semiconductor package 412 along perspective lines 4C-4C, in FIG. 4A, according to one implementation. In addition to the features shown in FIG. 4A and FIG. 4B, FIG. 4C shows semiconductor package 412 to include source contact 424 and one or more bond wires 480 electrically coupling gate 436 of group III-V FET 430 to source 444 of group IV FET 440 via source conductive carrier segment 474 and electrically conductive die attach material 468.

Also shown in FIG. 4C is creepage distance 464 corresponding to the effective electrical isolation distance of drain contact 422 from source contact 424 due to the presence of contour element 458. Creepage distance 464 corresponds in general to creepage distance 364, in FIG. 3C, and may share any of the characteristics attributed to that corresponding feature, above. It is noted that gate contact 426, shown in FIGS. 4A and 4B, is not visible in FIG. 4C due to the cross-section shown in FIG. 4C being taken between gate contact 426 and source contact 424.

Referring to FIGS. 4A, 4B, and 4C in combination, semiconductor package 412 is shown to include a power transistor in the form of composite power transistor 420. Semiconductor package 412 also includes drain contact 422, source contact 424, and gate contact 426 providing external connections to composite power transistor 420. In addition, contour element 458 is formed between drain contact 422 and source contact 424 in semiconductor package 412. As shown in FIG. 4C, contour element 458 increases creepage distance 464 between drain contact 422 and source contact 424 in semiconductor package 412 so as to increase a breakdown voltage of semiconductor package 412.

It is noted that although the implementations shown in FIGS. 4A, 4B, and 4C depict contour element 458 element as a concave element, such as a groove, with respect to top surface 452 of packaging dielectric 450, that representation is merely exemplary. In other implementations, contour element 458 may be convex with respect to top surface 452, and may take the form of a ridge in packaging dielectric 450 extruding above top surface 452.

Thus, the presence of contour element 458 between drain contact 422 and source contact 424 results in creepage distance 464 electrically isolating drain contact 422 from source contact 424 being greater than linear distance 460 physically separating drain contact 422 from source contact 424. Consequently, contour element 458 enables implementation of semiconductor package 412 having reduced dimensions, i.e., width 454 and length 456, while concurrently meeting the creepage distance requirements imposed by packaging of HV composite power transistor 420.

Figure 5:
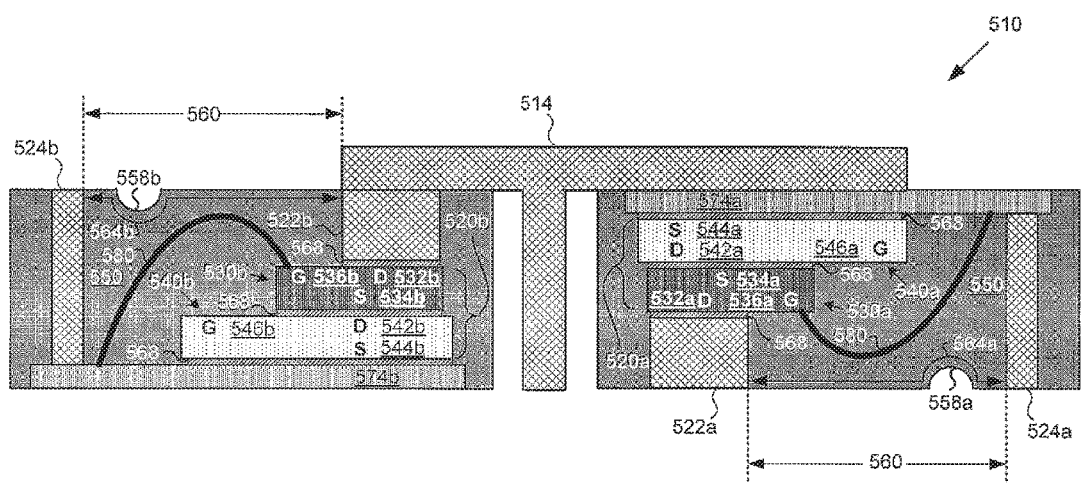
FIG. 5 shows a cross-sectional view of a portion of a compact high-voltage semiconductor package for housing a voltage converter power stage, according to one implementation.

Continuing to FIG. 5, FIG. 5 shows a cross-sectional view of a portion of a compact high-voltage semiconductor package for housing a voltage converter power stage, according to one implementation. Semiconductor package 510 includes power transistors 520a and 520b, shown as composite power transistors in the implementation of FIG. 5. In addition, semiconductor package 510 includes first and second drain contacts 522a and 522b, first and second source contacts 524a and 524b, and first and second gate contacts (not visible from the perspective shown in FIG. 5) to provide external connections to respective power transistors 520a and 520b.

It is noted that the cross-section shown in FIG. 5 corresponds in general to the cross-section shown in FIG. 4C, and described above. Consequently, it is to be understood that first and second gate contacts corresponding respectively in general to gate contact 426, shown in FIGS. 4A and 4B, are not visible in FIG. 5 due to the cross-section shown in FIG. 5 being taken between the gate contacts and source contacts 524a and 524b.

Semiconductor package 510 also includes first contour element 558a formed between first drain contact 522a and first source contact 524a in packaging dielectric 550 of semiconductor package 510, as well as second contour element 558b analogously formed between second drain contact 522b and second source contact 524b. As shown by FIG. 5, first drain contact 522a is separated from first source contact 524a by linear distance 560, and second drain contact 522b is separated from second source contact 524b by linear distance 560.

As further shown by FIG. 5, composite power transistor 520a includes group IV FET 540a cascoded with group III-V FET 530a, while composite power transistor 520b includes group IV FET 540b cascoded with group III-V FET 530b. Composite power transistors 520a and 520b each correspond in general to composite power transistors 220 and 420 in FIGS. 2, 4B, and 4C. That is to say, group III-V FET 530a/530b having drain 532a/532b, source 534a/534b, and gate 536a/536b corresponds in general to group III-V FET 230/430 having drain 232/432, source 234/434, and gate 236/436, and may share any of the characteristics attributed to that corresponding feature, above. In addition, group IV FET 540a/540b having drain 542a/542b, source 544a/544b, and gate 546a/546b corresponds in general to group IV FET 240/440 having drain 242/442, source 244/444, and gate 246/446, and may share any of the characteristics attributed to that corresponding feature, above.

Also shown in FIG. 5 are source conductive carrier segments 574a and 574b, electrically conductive die attach material 568, bond wires 580, switch node contact 514, first creepage distance 564a, and second creepage distance 564. Source conductive carrier segments 574a and 574b, electrically conductive die attach material 568, and bond wires 580 correspond respectively in general to source conductive carrier segment 474, electrically conductive die attach material 468, and bond wire(s) 480, in FIG. 4C, and may share any of the characteristics attributed to those corresponding features, above. Moreover, first and second creepage distances 564a and 564b, in FIG. 5, correspond in general to creepage distance 464, in FIG. 4C, and may share any of the characteristics attributed to that corresponding feature, above.

Semiconductor package 510 including switch node contact 514, first composite power transistor 520a, and second composite power transistor 520b, corresponds respectively in general to power stage MCM 110 including switch node 114, high side composite power transistor 120a, and low side composite power transistor 120b, in FIG. 1, and may share any of the characteristics attributed to those corresponding features, above. In other words, first composite power transistor 520a and second composite power transistor 520b are coupled to form a half bridge, wherein first composite power transistor 520a is the high side switch, and second composite power transistor 520b is the low side switch of the half bridge. Furthermore, and as shown by FIG. 5, switch node contact 514, which may be formed of any suitable conductive material, such as Cu, for example, electrically couples source contact 524a (corresponding to the composite source of high side composite power transistor 520a) to drain contact 522b (corresponding to the composite drain of low side composite power transistor 520b).

First contour element 558a increases first creepage distance 564a between first drain contact 522a and first source contact 524a in semiconductor package 510 so as to increase a breakdown voltage of semiconductor package 510. Similarly, second contour element 558b increases second creepage distance 564b between second drain contact 522b and second source contact 524b in semiconductor package 510 so as to increase the breakdown voltage of semiconductor package 510.

Thus, the presence of first contour element 558a between first drain contact 522a and first source contact 524a results in first creepage distance 564a electrically isolating first drain contact 522a from first source contact 524a being greater than linear distance 560 physically separating first drain contact 522a from first source contact 524a. In addition, the presence of second contour element 558b between second drain contact 522b and second source contact 524b results in second creepage distance 564b electrically isolating second drain contact 522b from second source contact 524b being greater than linear distance 560 physically separating second drain contact 522b from second source contact 524b. Consequently, first and second contour elements 558a and 558b enable implementation of semiconductor package 510 having reduced dimensions, i.e., a reduced width and/or a reduced length, while concurrently meeting the creepage distance requirements imposed by packaging of HV composite power transistors 520a and 520b.

Figure 6:
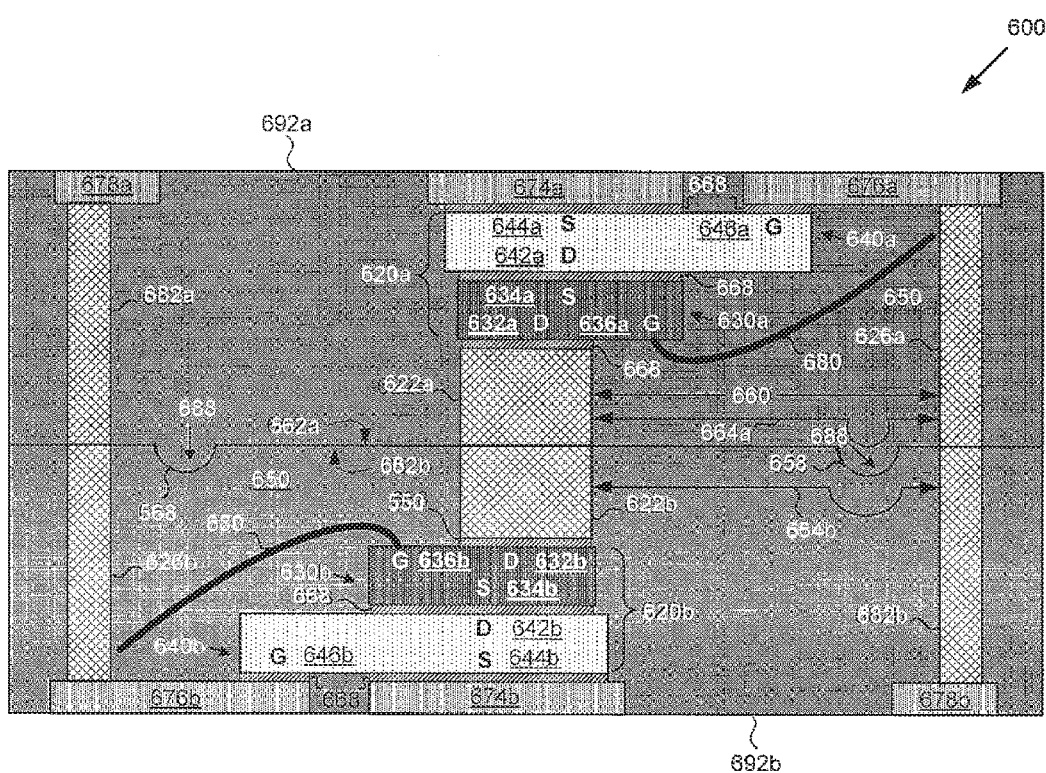
FIG. 6 shows a cross-sectional view of a compact high-voltage semiconductor package for housing a bidirectional switch, according to one implementation.

Referring to FIG. 6, FIG. 6 shows a cross-sectional view of a compact high-voltage semiconductor package for housing a bidirectional switch, according to one implementation. Composite semiconductor package 600 includes semiconductor package 692a housing power transistor 620a, joined with semiconductor package 692b housing power transistor power transistors 620b. It is noted that power transistors 620a and 620b are shown as composite power transistors in the implementation of FIG. 6. In addition, composite semiconductor package 600 includes drain contacts 622a and 622b, gate contacts 626a and 626b, and source contacts (not visible from the perspective shown in FIG. 6).

It is noted that the cross-section shown in FIG. 6 corresponds in general to the cross-section shown in FIG. 3B, and described above. Consequently, it is to be understood that source contacts corresponding respectively in general to source contact 324, shown in FIGS. 3A and 3C, are not visible in FIG. 6 due to those source contacts being situated behind and being obscured by gate contacts 626a and 626b from the perspective of FIG. 6.

Composite semiconductor package 600 also includes contour elements 688, at least one of which is formed in semiconductor package 692a between drain contact 622a and the source contact situated behind gate contact 626a. In addition, composite semiconductor package 600 includes contour elements 658, at least one of which is formed in semiconductor package 692b adjacent drain contact 622b, for example between drain contact 622b and the source contact situated behind gate contact 626b. According to the implementation shown in FIG. 6, contour elements 658 are implemented as respective grooves formed in packaging dielectric 650, while contour elements 688 are implemented as respective ridges in packaging dielectric 650.

As further shown by FIG. 6, composite power transistor 620a includes group IV FET 640a cascoded with group III-V FET 630a, while composite power transistor 620b includes group IV FET 640b cascoded with group III-V FET 630b. Composite power transistors 620a and 620b each correspond in general to composite power transistors 220 and 320 in FIGS. 2, 3B, and 3C. That is to say, group III-V FET 630a/630b having drain 632a/632b, source 634a/634b, and gate 636a/636b corresponds in general to group III-V FET 230/330 having drain 232/332, source 234/334, and gate 236/336, and may share any of the characteristics attributed to that corresponding feature, above. In addition, group IV FET 640a/640b having drain 642a/642b, source 644a/644b, and gate 646a/646b corresponds in general to group IV FET 240/340 having drain 242/342, source 244/344, and gate 246/346, and may share any of the characteristics attributed to that corresponding feature, above.

Also shown in FIG. 6 are source conductive carrier segments 674a and 674b, gate conductive carrier segments 676a and 676b, electrically conductive die attach material 668, bond wires 680, conductive posts 682a and 682b, creepage distances 664a and 664b, and linear distance 660. Source conductive carrier segments 674a and 674b, and gate conductive carrier segments 676a and 676b, correspond respectively in general to source conductive carrier segment 374, and gate conductive carrier segment 376, in FIG. 3B, and may share any of the characteristics attributed to those corresponding features, above.

Electrically conductive die attach material 668 and bond wires 680 correspond respectively in general to electrically conductive die attach material 368 and bond wire(s) 380, in FIGS. 3B and 3C, and may share any of the characteristics attributed to those corresponding features, above. It is noted that bond wires 680 represent electrical connection of group III-V transistor gates 636a and 636b to the respective source contacts situated behind gate contacts 626a and 626b, in FIG. 6.

Creepage distances 664a and 664b, in FIG. 6, correspond in general to creepage distance 364, in FIG. 3C, and may share any of the characteristics attributed to that corresponding feature, above. Moreover, linear distance 660, corresponds to linear distance 360 and may share any of the characteristics attributed to that corresponding feature, above.

Contour elements 688 increase creepage distance 664a in semiconductor package 692a so as to increase a breakdown voltage of composite semiconductor package 600. Similarly, contour elements 658 increase creepage distance 664b in semiconductor package 692b so as to increase the breakdown voltage of composite semiconductor package 600. In addition, and as shown in FIG. 6, contour elements 688 interface with and mechanically engage contour elements 658 in composite semiconductor package 600. According to the specific implementation shown in FIG. 6, drain contact 622a of semiconductor package 692a electrically couples composite power transistor 620a to composite power transistor 620b, via drain contact 622b and electrically conductive die attach material 668, to provide a bidirectional switch housed by composite semiconductor package 600.

Thus, the present application discloses a compact high-voltage semiconductor package. By forming one or more contour elements in a semiconductor package, the implementations disclosed in the present application increase a creepage distance between a drain contact and a source contact of the semiconductor package. Consequently, the contour element or elements utilized in the packaging solutions disclosed herein enable implementation of semiconductor packages having reduced dimensions, while concurrently meeting the creepage distance requirements for power transistors.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:
1. A semiconductor package comprising:
first and second power transistors;
first and second drain contacts, first and second source contacts, and first and second gate contacts to provide respective external connections to said first and second power transistors;

a first contour element formed between said first drain contact and said first source contact in a first surface of said semiconductor package;

a second contour element formed between said second drain contact and said second source contact in a second surface of said semiconductor package, said second surface being on an opposite side of said semiconductor package from said first surface;

said first contour element increasing a first creepage distance between said first drain contact and said first source contact in said semiconductor package so as to increase a breakdown voltage of said semiconductor package;

said second contour element increasing a second creepage distance between said second drain contact and said second source contact in said semiconductor package so as to increase said breakdown voltage of said semiconductor package; and a switch node contact electronically coupling said first source contact to said second drain contact.

2. The semiconductor package of claim 1, wherein at least one of said first contour element and said second contour element comprises a groove fanned in a packaging dielectric.

3. The semiconductor package of claim 1, wherein at least one of said first contour element and said second contour element comprises a ridge in a packaging dielectric.

4. The semiconductor package of claim 1, wherein said first and second power transistors are composite field-effect transistors (FETs) each including a group IV FET cascoded with a high-voltage (HV) group III-V transistor.

5. The semiconductor package of claim 1, wherein said first and second power transistors are coupled to form a half bridge, said first power transistor being a high side switch and said second power transistor being a low side switch of said half bridge.

6. A composite semiconductor package comprising:
a first semiconductor package housing a first power transistor joined with a second semiconductor package housing a second power transistor;

a first contour element formed between a first drain contact and a first source contact in said first semiconductor package;

a second contour element formed adjacent a second drain contact in said second semiconductor package;

said first contour element increasing a first creepage distance between said first drain contact and said first source contact in said first semiconductor package so as to increase a breakdown voltage of said composite semiconductor package;

said second contour element increasing a second creepage distance in said second semiconductor package so as to increase said breakdown voltage of said composite semiconductor package; and said first contour element interfacing with and mechanically engaging said second contour element.

7. The composite semiconductor package of claim 6, wherein at least one of said first contour element and said second contour element comprises a groove formed in a packaging dielectric.

8. The composite semiconductor package of claim 6, wherein at least one of said first contour element and said second contour element comprises a ridge in a packaging dielectric.

9. The composite semiconductor package of claim 6, wherein said first and second power transistors are composite field-effect transistors (FETs) each including a group IV FET cascoded with a high-voltage (HV) group III-V transistor.

10. The composite semiconductor package of claim 6, wherein said first and second power transistors are electrically coupled so as to provide a bidirectional switch.

* * * * *